United States Patent
Bottman et al.

(10) Patent No.: US 7,342,400 B2
(45) Date of Patent: Mar. 11, 2008

(54) METHOD AND APPARATUS FOR MEASURING EMPLOYING MAIN AND REMOTE UNITS

(75) Inventors: Jeffrey Bottman, Seattle, WA (US); Michael Kirita, Seattle, WA (US); Arthur B Liggett, Snohomish, WA (US)

(73) Assignee: Fluke Corporation, Everett, WA (US)

( * ) Notice: Subject to any disclaimer, the term of this patent is extended or adjusted under 35 U.S.C. 154(b) by 251 days.

(21) Appl. No.: 10/838,514

(22) Filed: May 3, 2004

(65) Prior Publication Data

US 2005/0242825 A1  Nov. 3, 2005

(51) Int. Cl.
  *G01R 19/00* (2006.01)
(52) U.S. Cl. .................. 324/543; 324/539; 324/605
(58) Field of Classification Search ................ 324/639, 324/543, 539, 605
  See application file for complete search history.

(56) References Cited

U.S. PATENT DOCUMENTS

| | | | | |
|---|---|---|---|---|
| 5,530,367 | A * | 6/1996 | Bottman | 324/616 |
| 5,751,152 | A | 5/1998 | DuBose et al. | 324/628 |
| 5,990,686 | A | 11/1999 | Bokey et al. | 324/523 |
| 6,002,671 | A | 12/1999 | Kahkoska et al. | 370/248 |
| 6,466,885 | B2 * | 10/2002 | Miller, Jr. | 702/116 |
| 6,998,853 | B2 * | 2/2006 | Renken | 324/543 |
| 2002/0163340 | A1 | 11/2002 | Sciacero et al. | 324/520 |

FOREIGN PATENT DOCUMENTS

| | | |
|---|---|---|
| EP | 0327191 A3 | 8/1989 |
| EP | 0789462 A3 | 8/1997 |
| EP | 0985933 A3 | 3/2000 |
| WO | 2004055527 A1 | 7/2004 |

OTHER PUBLICATIONS

Part 3: Carrier sense multiple access with collision detection (CSMA/CD) access method and physical layer specifications/ □□IEEE Std 802.3 2002 (Revision of IEEE Std 802.3 2000 Edition).*

* cited by examiner

*Primary Examiner*—Vincent Q. Nguyen
(74) *Attorney, Agent, or Firm*—Richard A. Koske; James H. Walters

(57) ABSTRACT

A test instrument employs main and remote test units at respective ends of a cable under test. The units operate in an active or passive measurement mode, wherein one of the units begins as the active unit, applying test signals to the cable under test to make a set of measurements related thereto, while the other unit takes measurements based on the signals applied by the first end. Then, after a set of measurements has been completed, the units swap roles, and the original passive end becomes the active end, applying test signal stimuli, while the original active end now becomes passive, and takes a series of corresponding measurements based from the test stimuli from the active end. The measurements are thereby overlapped and accomplished from both ends of the cable, saving time.

19 Claims, 5 Drawing Sheets

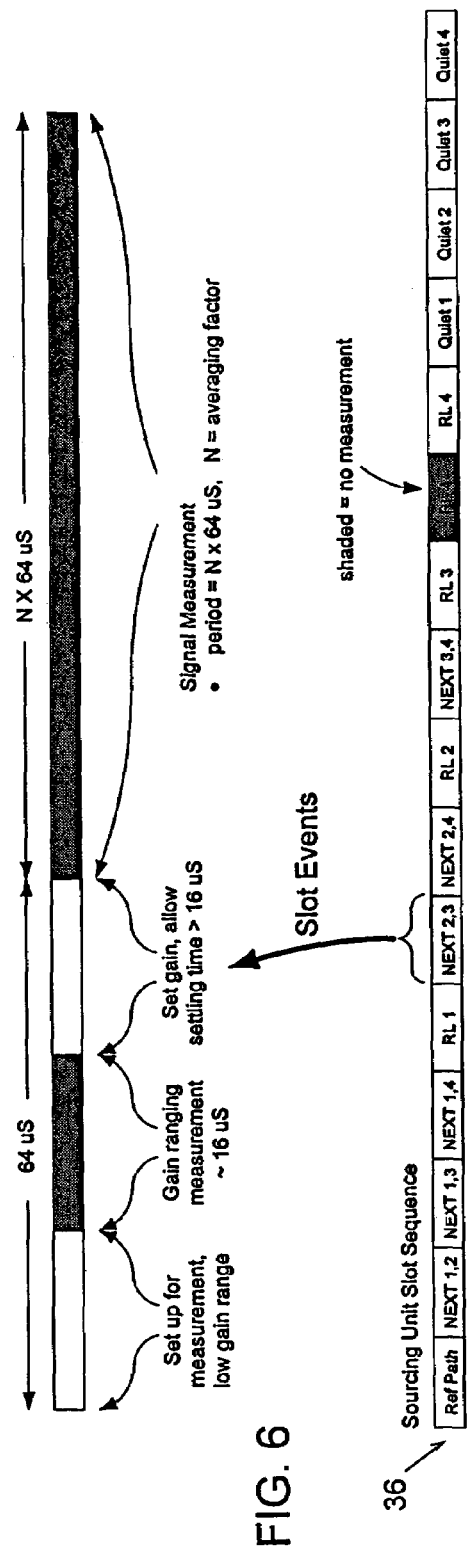
FIG. 6
FIG. 5

METHOD AND APPARATUS FOR MEASURING EMPLOYING MAIN AND REMOTE UNITS

BACKGROUND OF THE INVENTION

This invention relates to test and measurement and more particularly to network cable testing.

Fast test time is important in local area network (LAN) cable testing, because in a particular test scenario, 36 individual frequency response measurements need to be made, each at 1,168 test frequencies over a range of 1 to 600 MHz. This substantial number of tests can require a significant amount of time to complete. One approach to speeding up the measurement time heretofore is to employ a system wherein simultaneous measurements are made by providing two different test signals on different conductors pairs of a cable, employing two different non-interfering test frequencies, wherein the frequencies are offset so that the first test signal and second test signal do not interfere with the particular respective other test. This type of system places restrictions on the testing that can be done simultaneously, since the non-interfering frequency requirement must be observed.

SUMMARY OF THE INVENTION

In accordance with the invention, a main and remote test module cooperate wherein one module, say the main, operates to provide test signals and measurements, while the other module, in this case the remote, performs measurements at the same time as the main module from the test stimulus provided from the main. A series of tests are performed, whereupon the main and remote can switch functions such that the remote module then is applying the test signal and performing a series of measurements while the main module performs the various tests based from the signal stimulus from the remote module. A larger number of tests can thereby be performed in a given period of time.

Accordingly, it is an object of the present invention to provide an improved test instrument for enabling improved test time.

It is a further object of the present invention to provide an improved method of testing network cable making more efficient use of time.

It is yet another object of the present invention to provide an improved system and method for testing network cables.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

BRIEF DESCRIPTION OF THE DRAWINGS

FIG. 5 is diagram of the main and remote instruments when connected to a cable under test FIG. 6 is a diagram illustrating exemplary measurements made by the main and remote devices in a preferred embodiment and the timing thereof.

DETAILED DESCRIPTION

The system according to a preferred embodiment of the present invention comprises a network test instrument for testing LAN cables. For example, a four conductor pair cable tester is provided.

Figure 1:
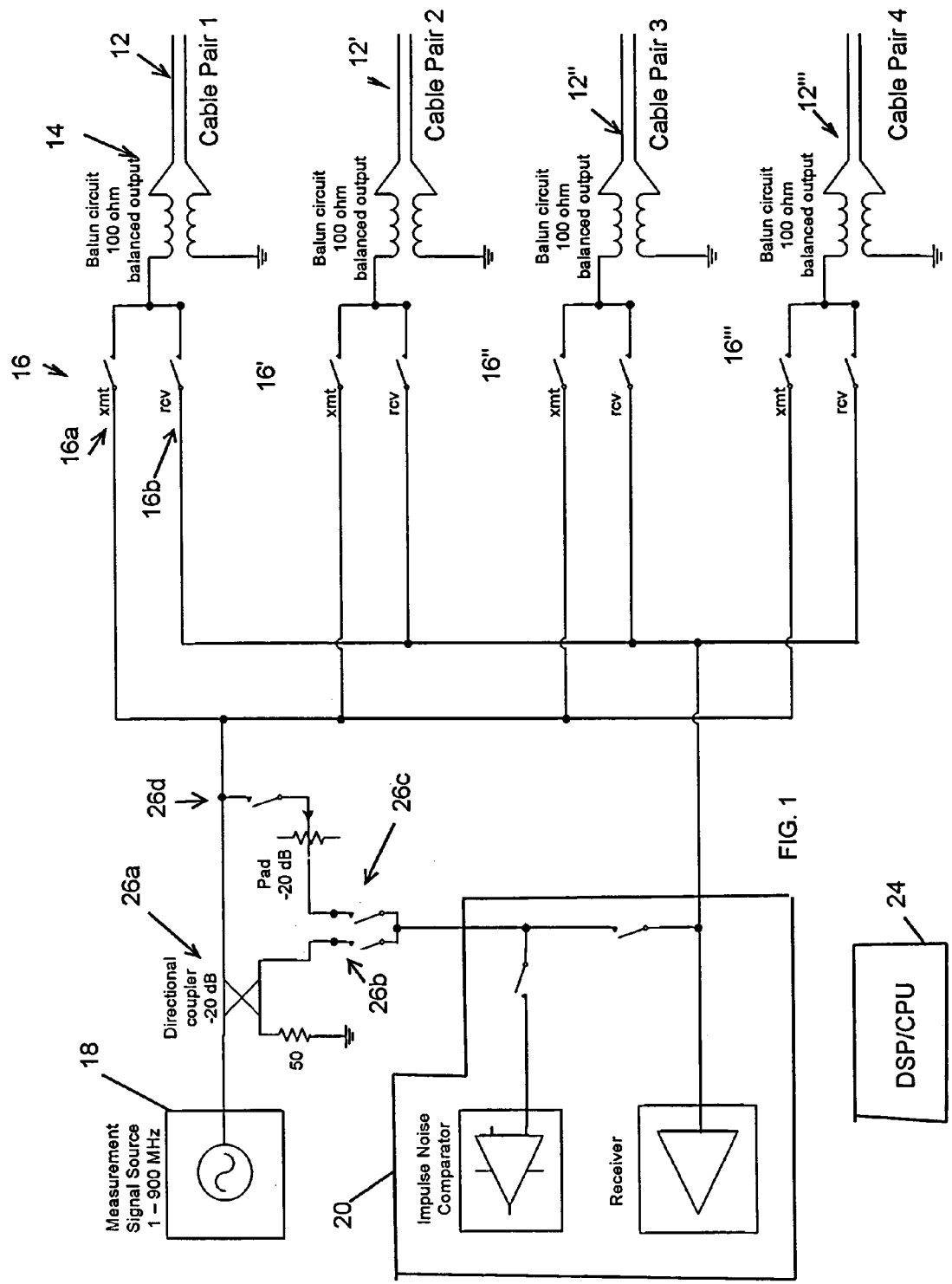
FIG. 1 is a diagram of major components of a test instrument in accordance with the invention.

Referring to FIG. 1, a circuit diagram illustrating the configuration of the test instrument 10, four cable pairs 12, 12', 12" and 12''' are connected via respective baluns 14 to switches 16, comprising a test signal transmit switch 16a, test signal receive switch 16b and communications transmit switch 16c. The transmit switch 16a receive test signals from measurement signal source 18, while the receive switches 16b connect to receiver 20, which in the illustrated embodiment includes a receiver and impulse noise comparator.

Between the receiver 20 and the measurement signal source 18, is a return path system 26, which includes a directional coupler 26a, and switches 26, one switch 26b connecting the receiver input to the directional coupler, another switch 26c connecting the receiver input to a third switch 26d which is connected to the signal source 18 and to the transmit switches 16a, and which has a signal attenuation of −20 db in the preferred embodiment. The directional coupler is interposed between the signal source 18 and the input to receiver 20 and also has a −20 db signal attenuation.

A DSP/CPU 24 is also suitably provided and interfaces with the various components of the instrument to receive and process data, transmit data, and to control and operate the testing operations.

Figure 2:
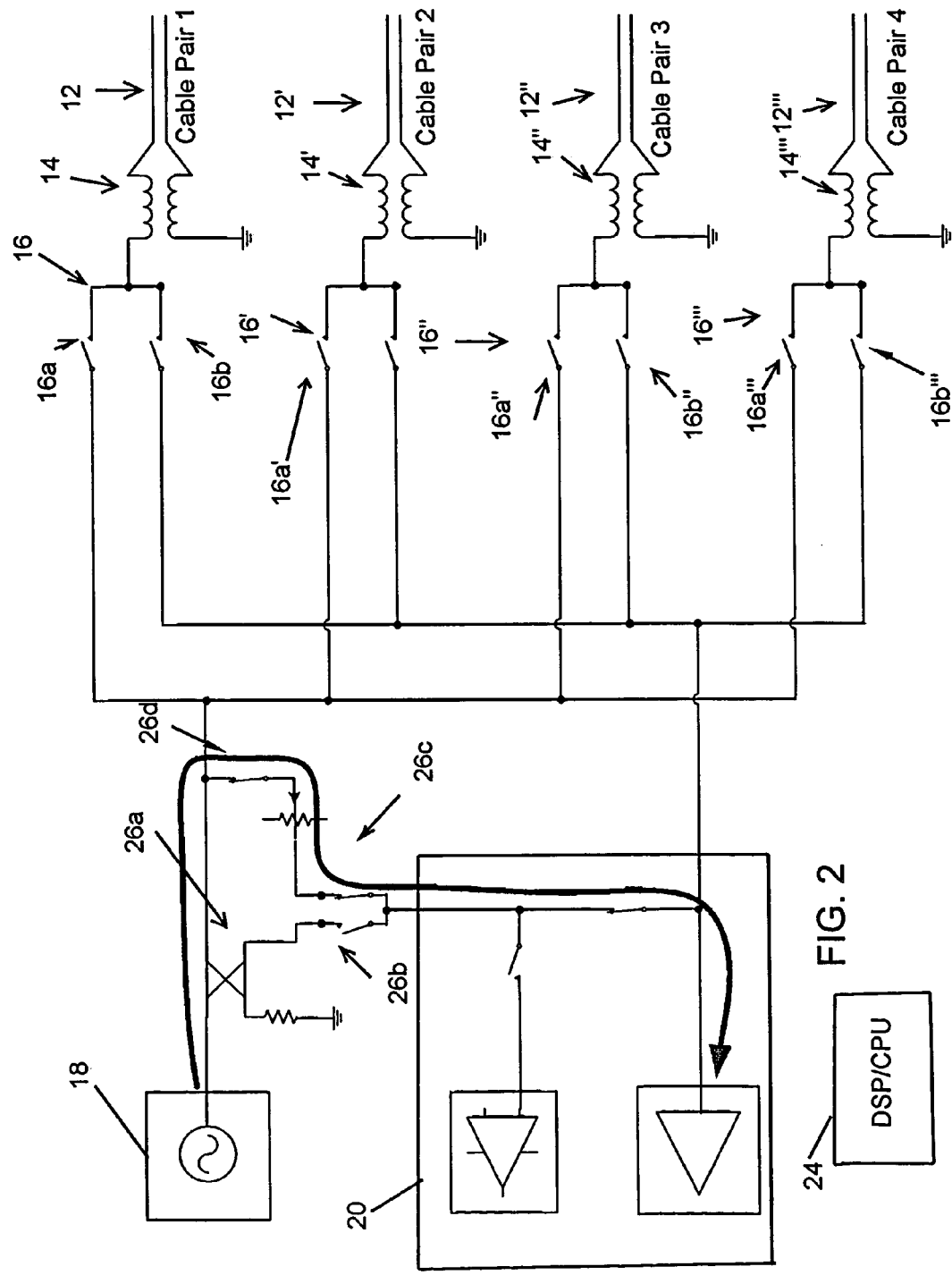
FIG. 2 is the test instrument of FIG. 1, configured to make a reference path measurement.

Referring now to FIG. 2, the test instrument of FIG. 1, configured to make a reference path measurement, wherein the instrument is calibrated, etc. In this configuration, the switches 16 are all opened, and the switches 26c and 26d are closed (26b is open), whereupon test signals from the signal source are supplied directly to the receiver.

Figure 3:
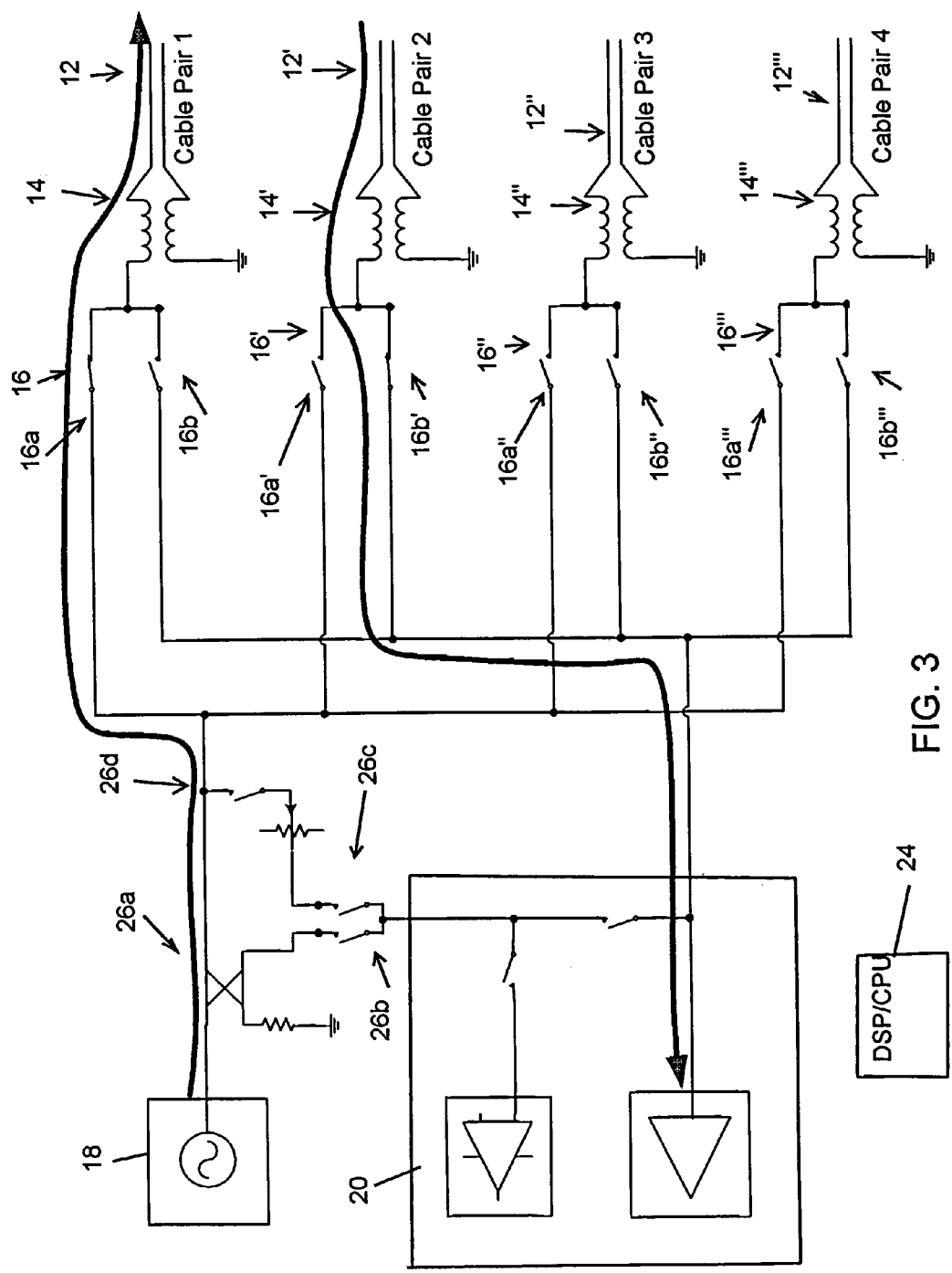
FIG. 3 is the test instrument of FIG. 1, where a NEXT measurement is being made.

In FIG. 3, the instrument is configured to perform a near end cross talk measurement on cable pairs 1 and 2 (NEXT 1,2). Here, switches 16a and 16b' are closed, so that the test signal from the signal source 18 is transmitted on cable pair 1 and received information from cable pair 2 is supplied to the receiver.

Figure 4:
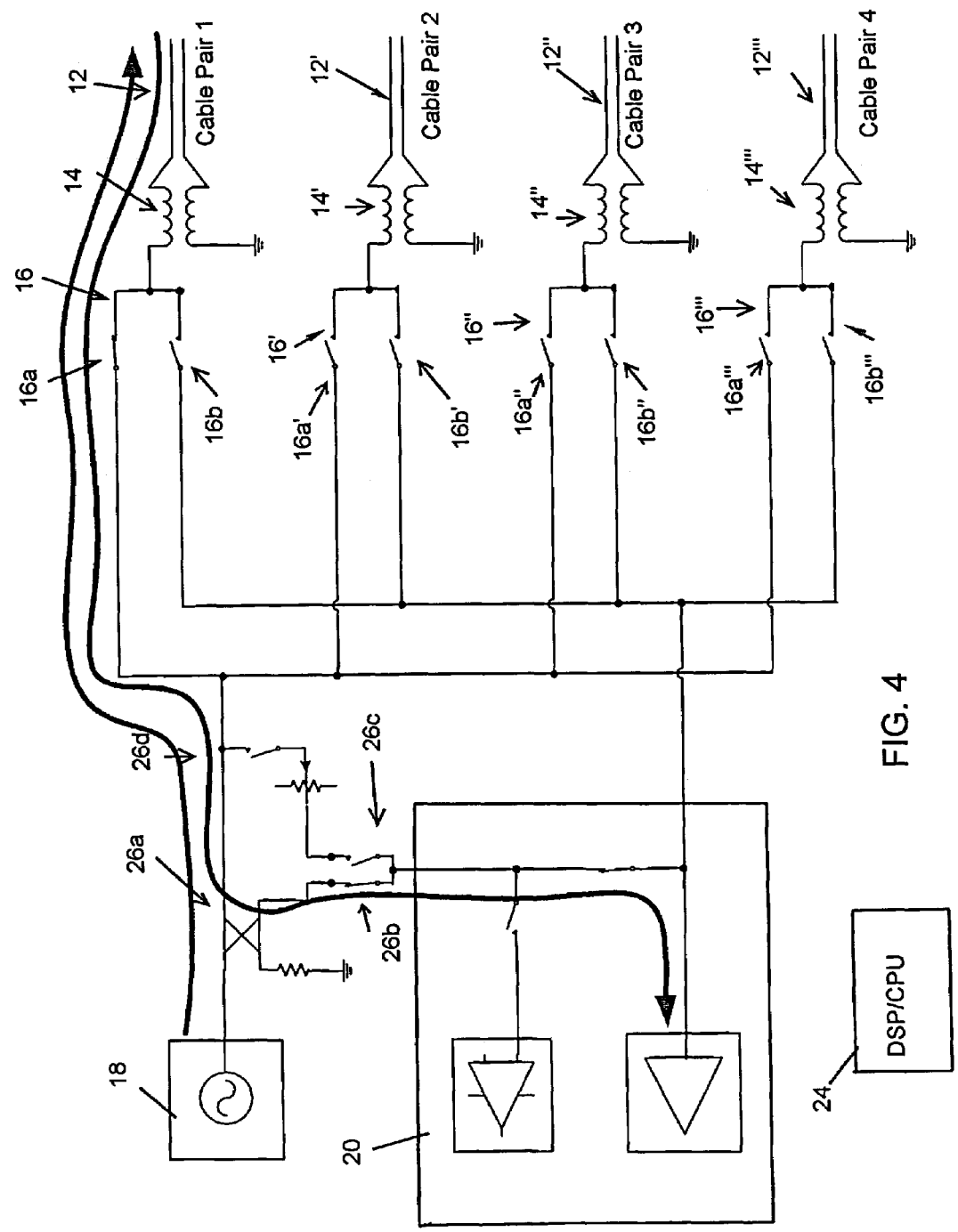
FIG. 4 is the test instrument of FIG. 1, where a return loss measurement is being made.

FIG. 4 shows the switch configuration for measuring return loss on cable pair 1, wherein transmit switch 16a is closed, (16b, 16c are open), 26b is closed (26c and 26d are open). In this configuration, the test signal from the signal source 16 is supplied to cable pair 1 and a reflected signal is picked up by the receiver 20 via the directional coupler 26a.

Having observed some specific switch configurations to enable certain measurements, the timing and various tests made in the preferred embodiment may be seen in connection with FIG. 5, a diagram illustrating the main and remote instrument configuration and with reference to FIG. 6, which illustrates the exemplary measurements made by the main and remote devices and timing thereof in a preferred embodiment.

In operation, the instrument employs a first instrument portion at one end of a cable 32 under test and a second instrument portion 34 at the opposite end of the cable. The two portions 30, 34, alternate between acting as the source end and the non-source end. Thus, in the upper portion of FIG. 5, instrument portion 30 is the source end, while portion 34 is the non-source end, and in the lower portion of FIG. 5, the two have exchanged roles such that the instrument portion 34 is now the source end and portion 30 is the non-source end. This operation enables a complete set of measurements to be performed, from both ends of the cable.

Referring to FIG. 6, the measurements are made simultaneously by the source and non-source end, wherein measurement set 36 is the source end detail and timing and measurement set 38 is the non-source end detail and timing. The measurements are broken down into time slots wherein at a first time slot, the source end performs a reference path measurement (which is the measurement discussed in connection with FIG. 2 hereinabove) to calibrate the device for other tests. The non-source unit makes no measurements at this time slot, because no test signal is yet being applied to the cable under test. In the following slot, the sourcing unit measures NEXT 1,2 (near end cross talk of cable pairs 1 to 2), while the non-source unit measures FEXT 1,3 (far end cross talk of cable pair 1 to 3), making use of the test signal applied by the sourcing unit. The following slot, near end cross talk of cable pair 1 to 3 is measured by the source unit, and FEXT 1,2 is measured by the non-source end. Following that, the source end applies a test signal to measure NEXT 1,4 (transmit switch 16a is closed to apply the test signal to cable pair 1, and receive switch 16b''' is closed to receive the return cross talk on cable pair 4). At this time slot, the non-source unit measures insertion loss of cable pair 1 (IL 1), providing the end to end transmission loss of the cable.

Next, the source unit makes a return loss measurement on cable pair 1 (RL 1) by determining the ratio of the reflected signal to incident signal, while the non-source uses the test signal supplied by the source to measure far end cross talk of cable pair 1 to 4 (FEXT 1,4). Measuring continues with the source end determining NEXT 2,3; NEXT 2,4; RL 2; NEXT 3,4 and RL 3, while the corresponding sequence for the non-source end is FEXT 2,4; IL 2; FEXT 2,3; IL 3 and FEXT 3,4.

In the slot following the RL3 source and FEXT 3,4 non-source measurement slots, the source has one slot where there is no measurement from that end, while the non-source end is measuring insertion loss of cable pair 4 (IL 4). Then, the following slot has the source measuring RL 4 (return loss of cable pair 4) while the non-source end is in passive termination mode, applying a passive 100 ohm terminating impedance to the cable under test. The next 4 slots on the source end are Quite 1, Quite 2, Quite 3 and Quiet 4, while the non-source end has slots Quiet 4, Quiet 3, Quiet 2 and Quiet 1. In each of these slots, both the source end and non-source end observe a silence in which the signal source from the test instrument is turned off, and measurements are made on the particular cable pair (e.g. QUIET 1 measures cable pair 1, QUIET 2 measures cable pair 2, etc.), determine whether any electromagnetic interference or other noise is present which might caused by an external source.

After the above-describe test sequence is completed, then the source and non-source end switch, so end 34 will now be the source end and will perform the test slot sequence 36, while end 32, which was previously the source end, now becomes the non-source end, performing the test slot sequence 38. In this manner, the sequences of tests are performed from each end of the cable.

Referring still to FIG. 6, a particular detail of measurement of a slot sequence is shown, in this case the sourcing unit NEXT 2,3 slot. The particular slot begins with a gain setting portion, which lasts 64 μs in the illustrated embodiment, so that the instrument gain is set to an appropriate level Next, a set of N 64 μs measurements are made, to provide averaging capability, wherein N is the averaging factor.

The operations described hereinabove are controlled by CPU 24, in the respective source and non-source units 30 and 34. The units communicate with one another via the cable pairs of the cable under test, using circuitry not shown, to exchange data for synchronizing start of measurements, measurement results, error conditions, and the like. The various switches are all controllable by the CPUs in the respective units.

Thus, in accordance with the invention, measurements are made simultaneously at both ends of a cable under test, with active test stimulus being provided at one end and measurements related to the stimulus being made at that end, while at the other end, passive measurements are made using the test signals from the first end. After a series of measurements are made, the two ends swap roles and the active end measurements are now made from the original second end, and the passive end measurements are made at the end that was at first the active end.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

What is claimed is:

1. A method for operating a test instrument for performing measurement operations on a cable under test, comprising:
   providing a first module for interfacing with a first end of a cable for supplying test stimulus thereto and for making measurements; and
   providing a second module for interfacing with a second end of the cable for making measurements based on the stimulus provided by said first module,
   wherein said measurement operations of said second module further comprise electromagnetic interference measurements.

2. A method for operating a test instrument for performing measurement operations on a cable under test, comprising:
   providing a first module for interfacing with a first end of a cable for supplying test stimulus thereto and for making measurements;
   providing a second module for interfacing with a second end of the cable for making measurements based on the stimulus provided by said first module; and
   applying said test stimulus to said cable from said first module and making measurements with said first module based on said test stimulus and making measurements with said second module based on said test stimulus,
   wherein said measurement operations of at least one of said first and second modules comprise electromagnetic interference measurements.

3. The method according to claim 2, wherein said second module making said measurements is in coordination with the stimulus and measurement timing of said first module.

4. The method according to claim 2, wherein said measurement operations of said first module are selected from the group consisting of near end cross talk and return loss.

5. The method according to claim 4, wherein said measurement operations of both said first and second modules comprise electromagnetic interference measurements.

6. The method according to claim 2, wherein said second module is adapted to provide a passive termination to the cable under test.

7. A method for operating a test instrument for performing measurement operations on a cable under test, comprising:
providing a first module for interfacing with a first end of a cable for supplying test stimulus thereto and for making measurements; and
providing a second module for interfacing with a second end of the cable for making measurements based on said test stimulus supplied by said first module,
further comprising making measurements with said first and second modules by supplying test stimulus from said first module and basing the measurements thereon,
wherein said second module is also provided with capability to supply test stimulus to said cable under test and for making measurements thereon,
wherein the measurements made by at least one of said first and second modules comprise electromagnetic interference measurements.

8. The method according to claim 7, further comprising after making measurements based on stimulus provided by said first module, providing stimulus from said second module and making measurements from said first and second modules based thereon.

9. A method for operating a test instrument for performing measurement operations on a cable under test, comprising:
providing a first module for interfacing with a first end of a cable for supplying test stimulus thereto and for making measurements;
providing a second module for interfacing with a second end of the cable for making measurements based on the stimulus provided by said first module; and
supplying said test stimulus from said first module to said cable under test and making measurements with said first and second module based on the response of said cable to said test stimulus,
wherein said measurement operations of said second module are selected from the group consisting of far end cross talk, insertion loss and electromagnetic interference.

10. A test instrument comprising:
a first test stimulus and measurement module adapted for interfacing with a first end of a cable under test;
a second test stimulus and measurement module adapted for interfacing with a second end of the cable under test;
wherein said test instrument employs a first mode wherein said first test module supplies stimulus to the cable and makes measurements based on the stimulus from the first module while said second test module simultaneously makes measurements based on the stimulus from said first module and in timing with the stimulus from said first module,
wherein said test instrument further employs a second mode comprising making electromagnetic interference measurements.

11. The test instrument according to claim 10, wherein said first test stimulus and measurement module makes measurements selected from the group consisting of near end cross talk and return loss.

12. A test instrument comprising:
a first test stimulus and measurement module adapted for interfacing with a first end of a cable under test;
a second test stimulus and measurement module adapted for interfacing with a second end of the cable under test;
wherein said test instrument employs a first mode wherein said first test module supplies stimulus to the cable and makes measurements based on the stimulus from the first module while said second test module simultaneously makes measurements based on the stimulus from said first module and in timing with the stimulus from said first module,
wherein said test instrument further employs a second mode, wherein said second test module supplies stimulus to the cable and makes measurements based on the stimulus from the second module while said first test module simultaneously makes measurements based on the stimulus from said second module and in timing with the stimulus from said second module,
wherein said test instrument further employs a third mode comprising making electromagnetic interference measurements.

13. A test instrument comprising:
a first test stimulus and measurement module adapted for interfacing with a first end of a cable under test;
a second test stimulus and measurement module adapted for interfacing with a second end of the cable under test;
wherein said test instrument employs a first mode wherein said first test module supplies stimulus to the cable and makes measurements based on the stimulus from the first module while said second test module simultaneously makes measurements based on the stimulus from said first module and in timing with the stimulus from said first module,
wherein said test instrument further employs a second mode, wherein said second test module supplies stimulus to the cable and makes measurements based on the stimulus from the second module while said first test module simultaneously makes measurements based on the stimulus from said second module and in timing with the stimulus from said second module,
wherein said second test stimulus and measurement module makes measurements selected from the group consisting of far end cross talk, insertion loss and electromagnetic interference.

14. A method for operating a test instrument for performing measurement operations on a cable under test, comprising:
providing a first module for interfacing with a first end of a cable for supplying test stimulus thereto and for making measurements;
providing a second module for interfacing with a second end of the cable for making measurements based on the stimulus provided by said first module, wherein said second module makes said measurements in coordination with the stimulus and measurement timing of said first module, wherein said second module is also provided with capability to supply test stimulus to said cable under test and for making measurements thereon;
making measurements with said first and second modules by supplying test stimulus from said first module and basing the measurements thereon; and
after making measurements based on stimulus provided by said first module, providing stimulus from said second module and making measurements from said first and second modules based thereon,
further comprising making electromagnetic interference measurements.

15. The method according to claim 14, wherein said measurement operations of said first module are selected from the group consisting of near end cross talk and return loss.

16. The method according to claim 14, wherein said second module is adapted to provide a passive termination to the cable under test.

17. A method for operating a test instrument for performing measurement operations on a cable under test, comprising:

providing a first module for interfacing with a first end of a cable for supplying test stimulus thereto and for making measurements;

providing a second module for interfacing with a second end of the cable for making measurements based on the stimulus provided by said first module, wherein said second module makes said measurements in coordination with the stimulus and measurement timing of said first module, wherein said second module is also provided with capability to supply test stimulus to said cable under test and for making measurements thereon;

making measurements with said first and second modules by supplying test stimulus from said first module and basing the measurements thereon; and after making measurements based on stimulus provided by said first module, providing stimulus from said second module and making measurements from said first and second modules based thereon, wherein said measurement operations of said first module are selected from the group consisting of near end cross talk and return loss, wherein said measurement operations of said first module further comprise electromagnetic interference measurements.

18. The method according to claim 17, wherein said measurement operations of said second module are selected from the group consisting of far end cross talk, insertion loss and electromagnetic interference.

19. The method according to claim 18, wherein said measurement operations of said second module further comprise electromagnetic interference measurements.

* * * * *